United States Patent
Tamura et al.

(10) Patent No.: US 7,356,798 B2
(45) Date of Patent: Apr. 8, 2008

(54) SEMICONDUCTOR INTEGRATED CIRCUIT ROUTING METHOD AND RECORDING MEDIUM WHICH STORES ROUTING SOFTWARE

(75) Inventors: Naoyuki Tamura, Kawasaki (JP); Takayuki Kamei, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 311 days.

(21) Appl. No.: 11/186,891

(22) Filed: Jul. 22, 2005

(65) Prior Publication Data
US 2006/0184909 A1  Aug. 17, 2006

(30) Foreign Application Priority Data
Feb. 15, 2005  (JP) ............................. 2005-037503

(51) Int. Cl.
*G06F 17/50*  (2006.01)
(52) U.S. Cl. .............................. 716/12; 716/13; 716/14
(58) Field of Classification Search .................. 716/12, 716/13, 14
See application file for complete search history.

(56) References Cited

U.S. PATENT DOCUMENTS

| | | | |
|---|---|---|---|
| 5,509,123 A * | 4/1996 | Dobbins et al. ............ 709/243 |
| 5,784,600 A * | 7/1998 | Doreswamy et al. ....... 713/503 |
| 6,038,383 A | 3/2000 | Young et al. .......... 395/500.06 |
| 6,523,160 B2 * | 2/2003 | Kondou ....................... 716/12 |

FOREIGN PATENT DOCUMENTS

JP  2002-313921  10/2002

* cited by examiner

*Primary Examiner*—Sun James Lin
(74) *Attorney, Agent, or Firm*—Oblon, Spivak, McClelland, Maier & Neustadt, P.C.

(57) ABSTRACT

A method including receiving, for respective terminals, wiring enable/disable information which sets a region where a connection of a wiring line is enabled and a region where a connection of a wiring line is disabled, and storing the wiring enable/disable information, and determining, using the wiring enable/disable information, whether a connection of a wiring line to a predetermined portion of a terminal of an element is enabled, and when the connection of the wiring line is enabled, executing the connection, wherein the wiring enable/disable information sets wiring enable regions at two end portions of the terminal, sets a wiring disable region at a central portion of the terminal except the two end portions, and sets an interval between either end face of the terminal and another wiring line different in longitudinal direction from the terminal to a predetermined interval not smaller than a minimum interval defined by a design rule.

12 Claims, 13 Drawing Sheets

(PRIOR ART)

```
MACRO cellA
      :
   PIN in
      DIRECTION INPUT ;
      USE SIGNAL ;
      PORT                                              ┐
         LAYER M2 ;                                      ├─PC1
            RECT  0.90   0.70   1.10   1.50 ;           ┘
      END
   END in
      :
   OBS
      LAYER M2 ;
         RECT 1.90    0.90   2.10    1.90   ;
   END
      :
END cellA
```

FIG. 7

```
MACRO cellA
    :
    PIN in
        DIRECTION INPUT ;
        USE SIGNAL ;
        FIGURE
            RECT  0.90    0.70    1.10    1.50    ;
        END
        PORT                                              ─PC2
            LAYER  M2  dir    X ;
                0.70    0.90    at    0.90    ;
                1.30    1.50    at    0.90    ;
                0.70    0.90    at    1.10    ;
                1.30    1.50    at    1.10    ;
            LAYER  M2  dir    Y ;
                0.90    1.10    at    0.70    ;
                0.90    1.10    at    1.50    ;
            LAYER  M2  dir    Z ;
                RECT   0.90    0.70    1.10    1.50 up   ;
        END
    END in
        :
    OBS
        LAYER  M2 ;
            RECT  1.90    0.90    2.10    1.90    ;
        LAYER  M2  dir    X ;
            0.90    1.30    at    0.90    ;
            0.90    1.30    at    1.10    ;
            0.40    0.70    at    0.90    ;
            0.40    0.70    at    1.10    ;
            1.50    1.80    at    0.90    ;
            1.50    1.80    at    1.10    ;
            0.60    0.90    at    1.90    ;
            2.10    2.40    at    1.90    ;
            0.60    0.90    at    2.10    ;
            2.10    2.40    at    2.10    ;
    END
        :
END cellA
```

SEMICONDUCTOR INTEGRATED CIRCUIT ROUTING METHOD AND RECORDING MEDIUM WHICH STORES ROUTING SOFTWARE

CROSS REFERENCE TO RELATED APPLICATION

This application is based upon and claims benefit of priority under 35 USC § 119 from the Japanese Patent Application No. 2005-37503, filed on Feb. 15, 2005, the entire contents of which are incorporated herein by reference.

BACKGROUND OF THE INVENTION

The present invention relates to a semiconductor integrated circuit routing method and a recording medium which stores routing software.

To perform automatic place & routing using elements such as a standard cell in a semiconductor integrated circuit, it is necessary to place a plurality of elements and then connect the terminals of the elements by wiring lines.

A conventional routing process uses only rectangle information on the outer shapes of the terminal and wiring line. A notch may be formed in connecting a wiring line to an element. As micropatterning in the process progresses, the presence of a circuit pattern containing a notch poses a problem in a patterning process.

If, however, the wiring shape is so changed as to bury the notch, the wiring width becomes larger, and the wiring interval must be widened, undesirably increasing the circuit area.

In some cases, the interval must be designed larger than a wiring interval permitted by the design rule depending on the longitudinal directions of a terminal and wiring line, a wiring enable region where connection of a wiring line to a terminal is enabled, or a wiring disable region where connection of a wiring line is disabled. The conventional routing process is, however, performed on the basis of simple rectangle information of a terminal, as described above. The process cannot be done in consideration of the directions of a terminal and wiring line and the wiring enable region and wiring disable region of a terminal, decreasing the process efficiency or unnecessarily increasing the circuit area.

A reference concerning a conventional routing method is as follows.

Japanese Patent Laid-Open No. 2002-313921

SUMMARY OF THE INVENTION

According to one aspect of the invention, there is provided a method of routing a semiconductor integrated circuit by using a routing apparatus having an input unit, a storage unit, and an arithmetic unit, comprising:

receiving, by the input unit, for respective terminals of a plurality of elements contained in the semiconductor integrated circuit, wiring enable/disable information which sets a region where connection of a wiring line is enabled and a region where connection of a wiring line is disabled, and storing, by the storage unit, the wiring enable/disable information; and determining, by the arithmetic unit, by using the wiring enable/disable information stored in the storage unit, whether connection of a wiring line to a predetermined portion of the terminal of the element is enabled, and when the arithmetic unit determines that connection of the wiring line is enabled, execute connection.

According to one aspect of the invention, there is provided a computer-readable recording medium which stores software for executing routing of a semiconductor integrated circuit, wherein the routing software causes a computer to execute a routing method comprising, setting, for respective terminals of a plurality of elements contained in the semiconductor integrated circuit, a region where connection of a wiring line is enabled and a region where connection of a wiring line is disabled, and setting wiring enable/disable information, and determining on the basis of the wiring enable/disable information whether connection of a wiring line to a predetermined portion of the terminal of the element is enabled, and when connection of the wiring line is determined to be enabled, executing connection.

DETAILED DESCRIPTION OF THE INVENTION

Embodiments of the present invention will be described below with reference to the accompanying drawings.

(1) FIRST EMBODIMENT

Contents defined in information used in a routing method according to a comparative example will be described.

Figure 1:
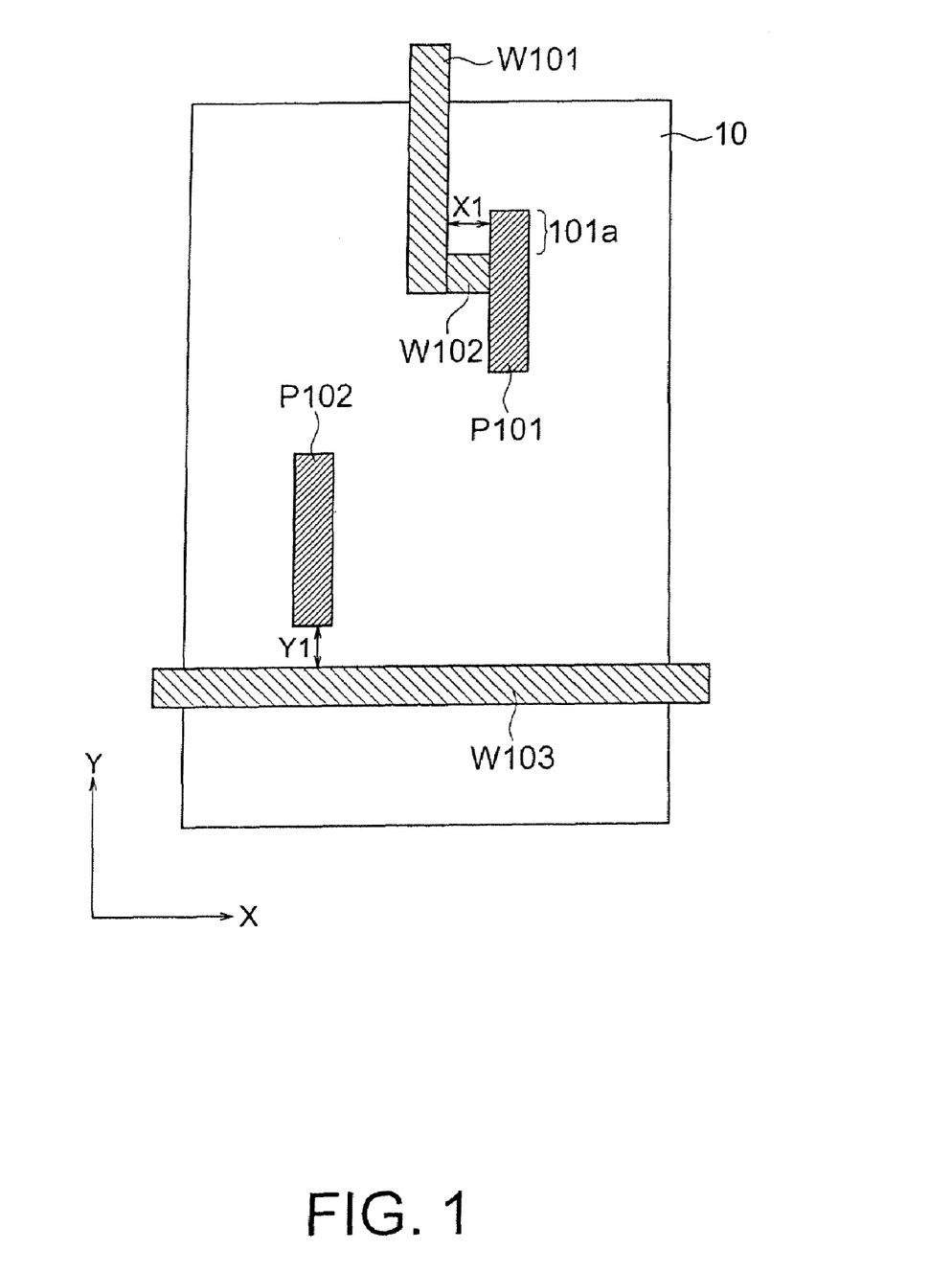
FIG. 1 is an explanatory view showing contents defined in information used in a routing method according to a comparative example.

In a semiconductor integrated circuit 10 shown in FIG. 1, a notch 101a may be formed when a wiring line W102 in the X direction is connected to a terminal P101 at a distance X1 in accordance with the design rule in connecting the terminal P101 whose longitudinal direction is the Y direction to a wiring line W101 whose longitudinal direction is also the Y direction. The information defines that formation of the notch 101a must be avoided.

When a terminal P102 and wiring line W103 having different longitudinal directions are placed close to each other, the information defines that the distance between them must be an interval Y1 larger than an interval defined by a general design rule.

To the contrary, contents defined in information used in a routing method according to the first embodiment will be explained with reference to FIG. 2.

For example, regions A1 and A3 on the side surface of the upper end portion of a terminal P1 having a longitudinal direction in the Y direction correspond to wiring enable regions (hatched regions) where a wiring line can be connected in the X direction. A region A2 on the end face of the upper end portion corresponds to a wiring enable region where a wiring line can be connected in the Y direction.

Similarly, regions A4 and A6 on the side surface of the lower end portion correspond to wiring enable regions where a wiring line can be connected in the X direction. A region A5 on the end face of the lower end portion corresponds to a wiring enable region where a wiring line can be connected in the Y direction.

Assume that the regions A1, A3, A4, and A6 each have a length Y2. The length Y2 is equal to the width of wiring lines connected to the regions A1, A3, A4, and A6, and this avoids formation of a notch.

A notch is formed at the upper or lower end when wiring lines are connected in the X direction to regions A7 and A8 defined at the center except the two end portions. Hence, the regions A7 and A8 correspond to wiring disable regions (dotted regions) where connection of a wiring line is disabled. In this case, assume that the regions A7 and A8 each have a length Y3.

The range of the distance Y1 from the upper end and the range of the distance Y1 from the lower end correspond to wiring disable regions where a wiring line having a longitudinal direction in the X direction cannot exist.

Consequently, for the terminal P1 having a longitudinal direction in the Y direction, wiring enable regions where a wiring line can be connected in the X direction exist at a total of four portions at the upper and lower end portions, and wiring enable regions where a wiring line can be connected in the Y direction exist at a total of two portions on the upper and lower end faces. Similarly, for a terminal (not shown) having a longitudinal direction in the X direction, wiring enable regions where a wiring line can be connected in the Y direction exist at a total of four portions at the upper and lower end portions, and wiring enable regions where a wiring line can be connected in the X direction exist at a total of two portions on the upper and lower end faces.

Information on wiring enable regions and wiring disable regions is created using X- and Y-coordinates for each terminal.

Figure 3:
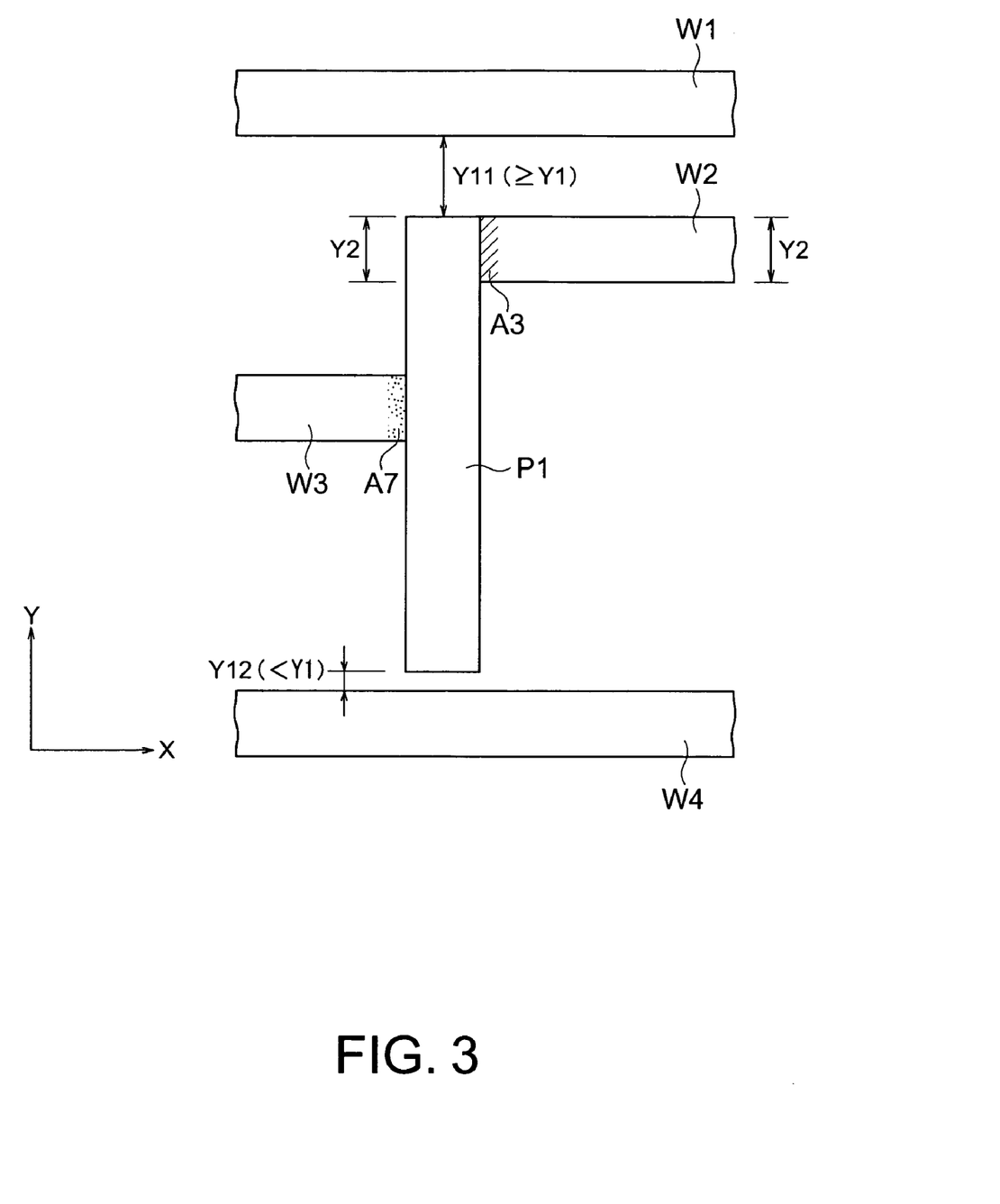
FIG. 3 is an explanatory view showing an example of routing on the basis of the information according to the first embodiment.

An example of connecting a wiring line to a terminal on the basis of this information will be explained with reference to FIG. 3. A wiring line W2 having a longitudinal direction in the X direction and a wiring width Y2 is connected to the wiring enable region A3 at the upper end portion of the terminal P1 having a longitudinal direction in the Y direction so as not to form any notch. Connection of the wiring line W2 is permitted.

However, it is not permitted to connect a wiring line W3 to the wiring disable region A7 of a terminal P1.

It is permitted to place a wiring line W1 having a longitudinal direction in the X direction at the distance Y2 apart equal to or larger than the distance Y1 from the upper end of the terminal P1.

It is not permitted to place a wiring line W4 having a longitudinal direction in the X direction at a distance Y12 closer than the distance Y1 to the lower end of the terminal P1.

Figure 4:
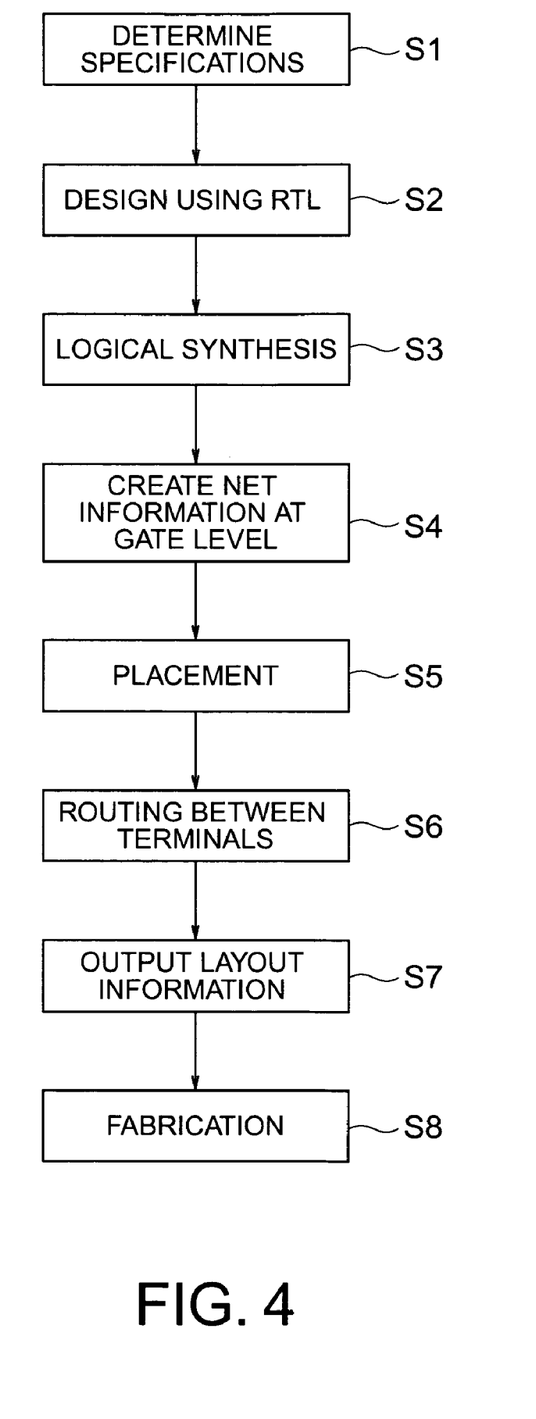
FIG. 4 is a flowchart showing a sequence from determination of the specifications of a semiconductor integrated circuit to fabrication of the semiconductor integrated circuit.

A sequence from determination of the specifications of a semiconductor integrated circuit to fabrication of the semiconductor integrated circuit will be described with reference to the flowchart of FIG. 4.

In step S1, the specifications of a chip (semiconductor integrated circuit) are determined.

In step S2, a design is determined using the RTL language.

In step S3, logical synthesis is performed on the basis of the created design.

In step S4, net information which defines connection between elements such as a standard cell is created at the gate level on the basis of the created logical synthesis.

In step S5, elements are placed on the chip.

In step S6, the terminals of the placed elements are connected by wiring lines, and layout information is created.

In step S7, the created layout information is output.

In step S8, a chip is fabricated using the layout information.

Figure 5:
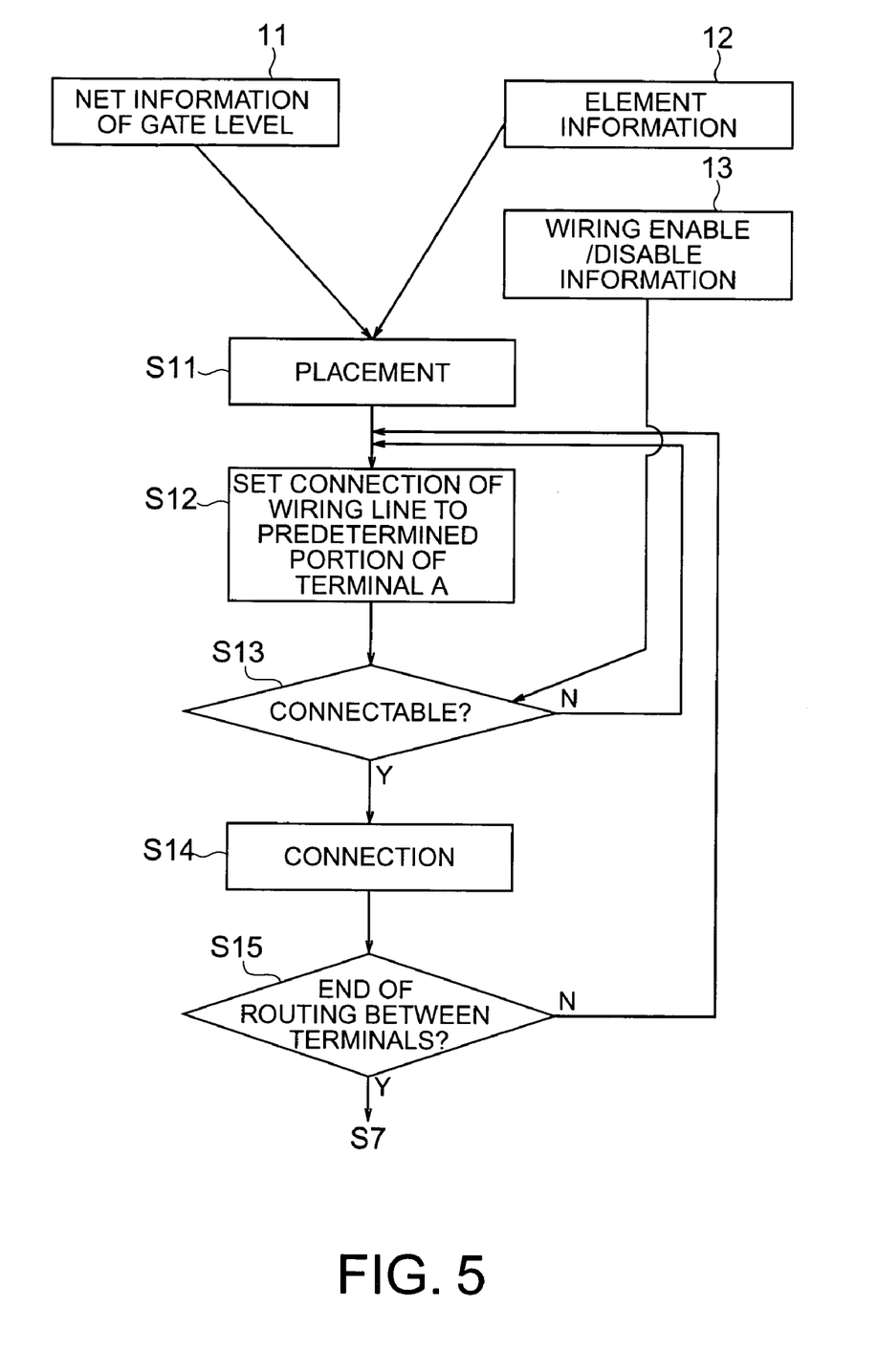
FIG. 5 is a flowchart showing the sequence of the routing method according to the first embodiment.

The semiconductor integrated circuit routing method according to the first embodiment is applied to the element placement process in step S5 and the inter-terminal routing process in step S6 in the above sequence. This sequence is shown in the flowchart of FIG. 5.

Figure 6:
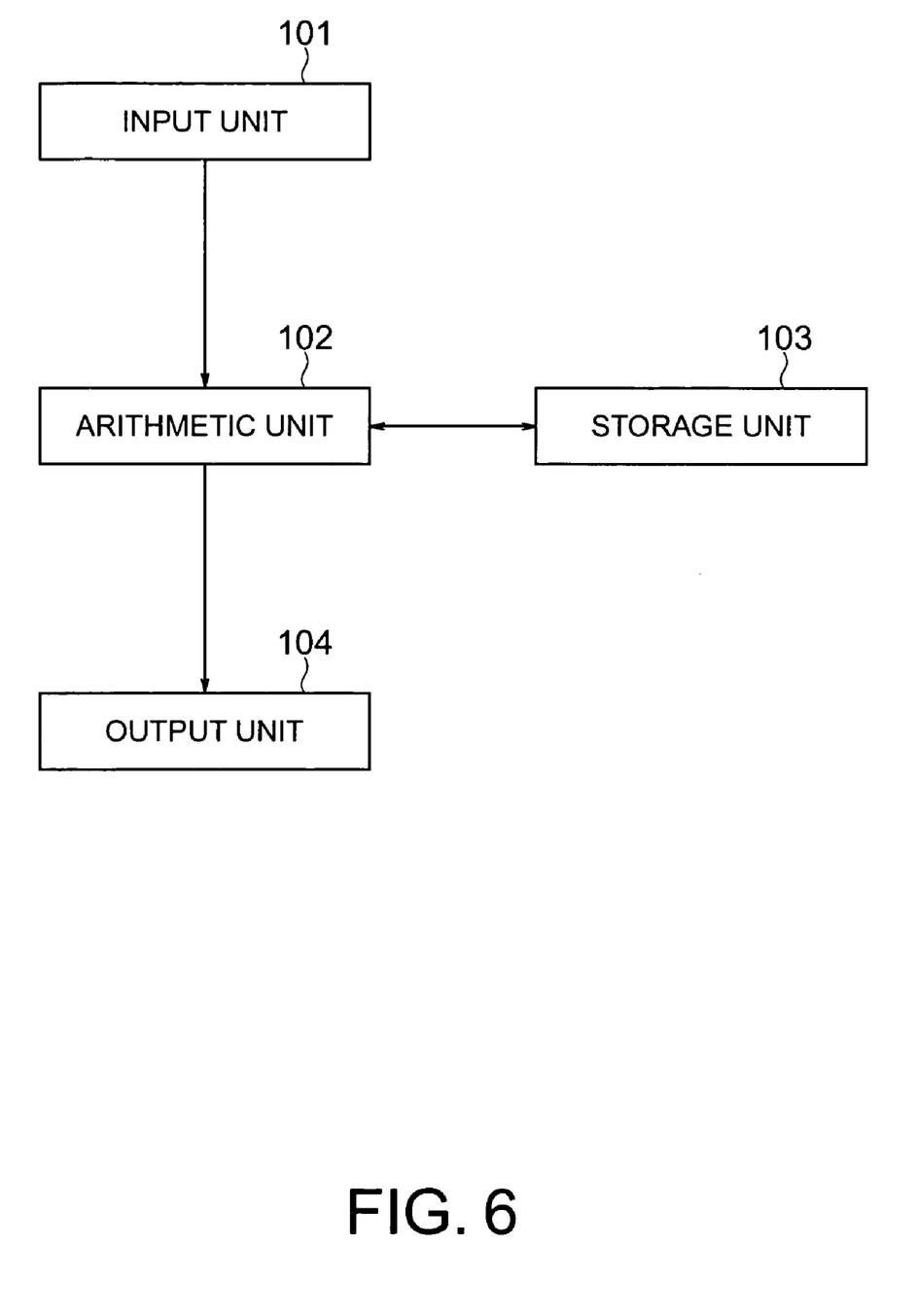
FIG. 6 is a block diagram showing the arrangement of a routing apparatus implemented by software which causes a computer to execute the routing method.

A routing apparatus used to execute the routing method according to the first embodiment has an arrangement as shown in FIG. 6, i.e., an input unit 101, arithmetic unit 102, storage unit 103, and output unit 104. The routing apparatus is implemented by causing a computer to read routing software according to the first embodiment that is stored in a computer-readable recording medium, and execute the routing process.

In step S11, net information 11 of the gate level and element information 12 on the outer shape of an element are input to the input unit 101, sent to the storage unit 103 via the arithmetic unit 102, and stored in the storage unit 103.

Further, wiring enable/disable information 13 representing that wiring connection to the terminal of each element is enabled or disabled is input to the input unit 101, sent to the storage unit 103 via the arithmetic unit 102, and stored in the storage unit 103.

Figure 2:
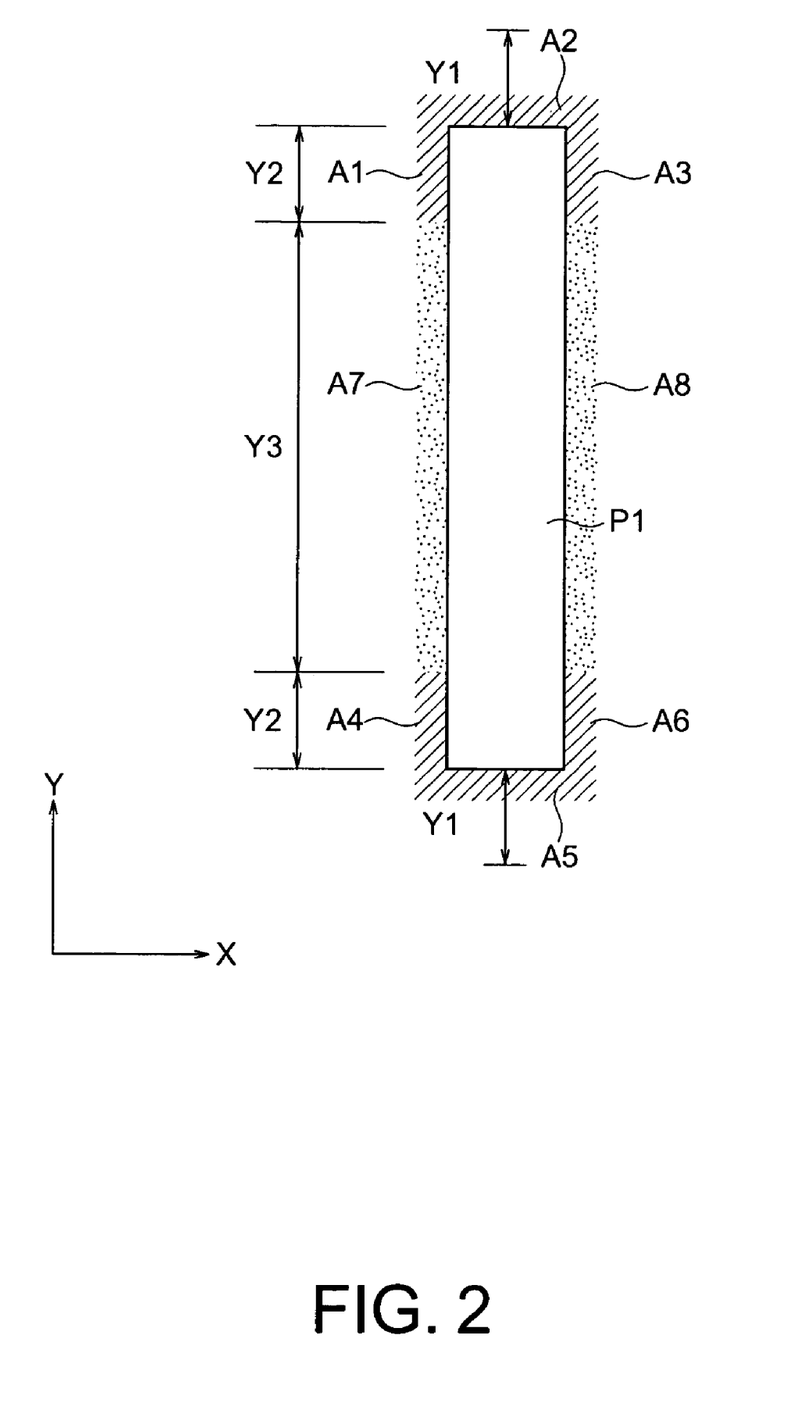
FIG. 2 is an explanatory view showing a wiring enable region and wiring disable region which are defined in information used in a routing method according to the first embodiment.

The wiring enable/disable information 13 concerns wiring enable regions where wiring connection is enabled at two end portions of a terminal having a longitudinal direction in the X or Y direction, as shown in FIG. 2, wiring disable regions where wiring connection is disabled at a central portion except the two end portions, a wiring line different in longitudinal direction from the terminal, and a necessary interval from the end face of the terminal.

If necessary, the arithmetic unit 102 reads out the net information 11 and element information 12 which are stored in the storage unit 103, and executes a routing process for each element on the chip.

In step S12, the arithmetic unit 102 sets connection of a wiring line to a predetermined portion of the terminal of each element or placement of a wiring line.

In step S13, the arithmetic unit 102 determines on the basis of the wiring enable/disable information 13 whether connection or placement of the wiring line is enabled.

If connection or placement is disabled, the flow returns to step S12 to set new connection or placement of the wiring line other than the current connection or placement of the wiring line.

If connection or placement is enabled, the flow shifts to step S14 to connect or place the wiring line.

In step S15, it is determined whether routing between all terminals has ended. If NO in step S15, the flow returns to step S12; if YES, shifts to step S7 in FIG. 4 to output created layout information.

In this manner, in steps S12 to S14, a target terminal is connected while a connectable region is searched for. When a wiring line runs through a region near the terminal, the wiring line is laid out while a runnable region is searched for. As a result, routing between terminals is executed.

Figure 7:
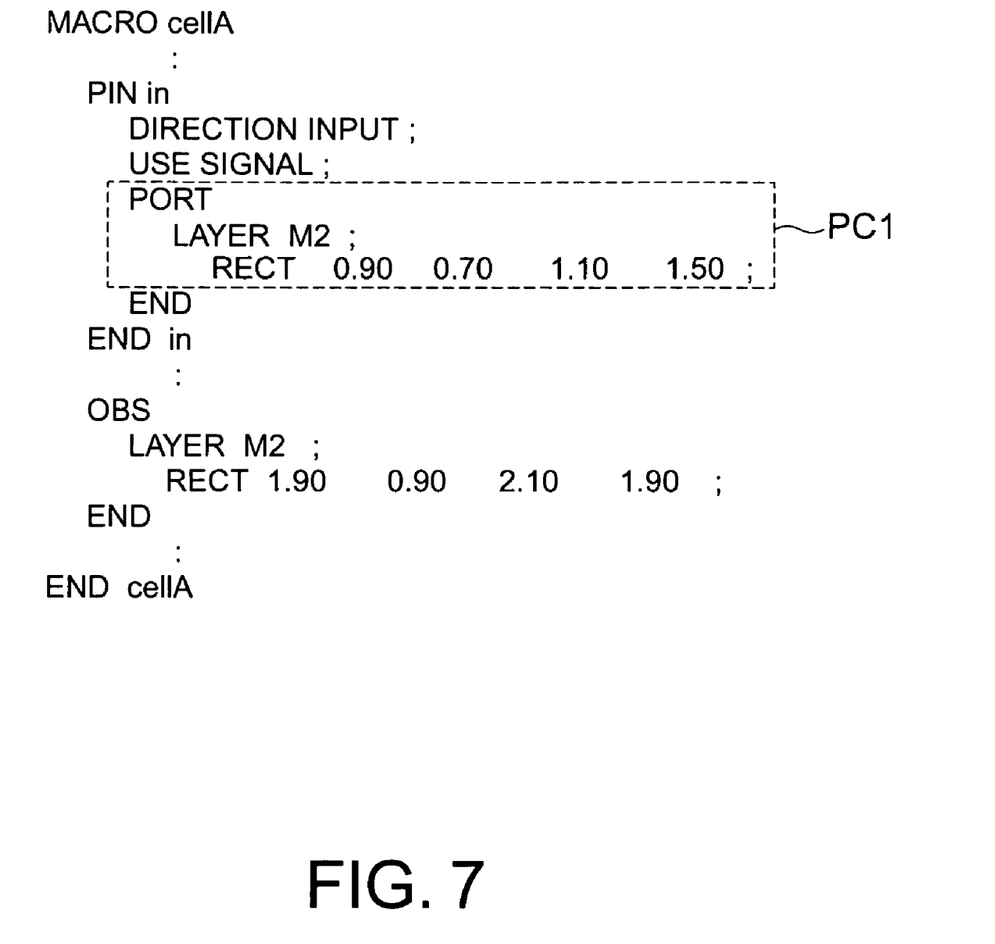
FIG. 7 is an explanatory view showing an example of the description format of information on a terminal that is used in the comparative example.

FIG. 7 shows an example of a description format which describes information on the outer shape of a terminal according to the comparative example.

A part PC1 surrounded by a dotted line defines that the outer shape of a terminal M2 is rectangular, and also defines vertex information (0.90, 0.70, 1.10, 1.50) at four corners.

The comparative example defines only vertex information of each rectangular terminal.

Figure 8:
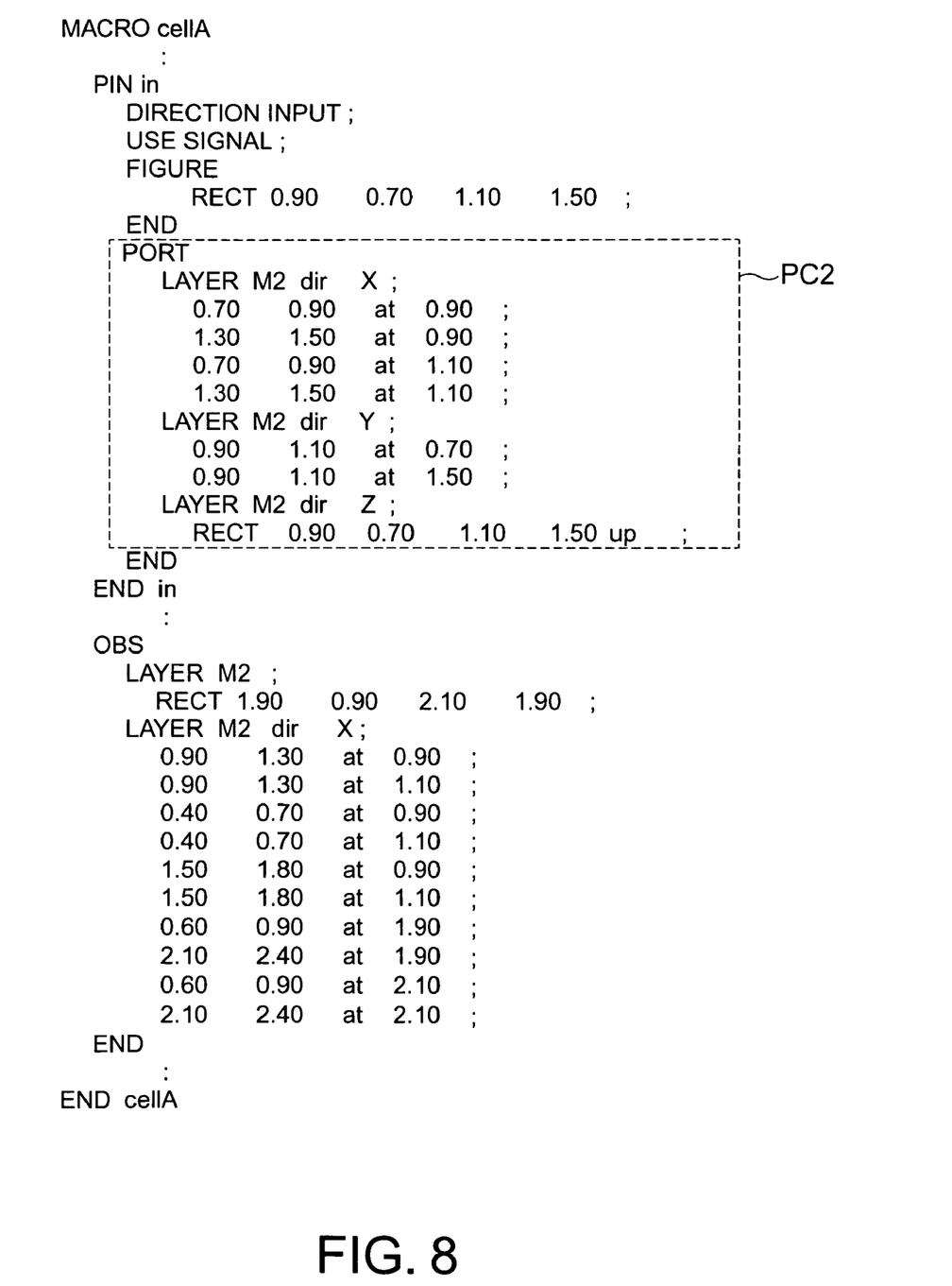
FIG. 8 is an explanatory view showing an example of the description format of information on a terminal that is used in the routing method according to the first embodiment.

To the contrary, the first embodiment adopts information represented by a part PC2 surrounded by a dotted line in FIG. 8.

Regions where connection of a wiring line having a longitudinal direction in the X direction to the terminal M2 is permitted are set at the following four portions.

(1) The range of Y-coordinates (0.70 to 0.90) at an X-coordinate (0.90)

(2) The range of Y-coordinates (1.30 to 1.50) at an X-coordinate (0.90)

(3) The range of Y-coordinates (0.70 to 0.90) at an X-coordinate (1.10)

(4) The range of Y-coordinates (1.30 to 1.50) at an X-coordinate (1.10)

Also, regions where connection of a wiring line having a longitudinal direction in the Y direction to the terminal M2 is permitted are set at the following two portions.

(1) The range of X-coordinates (0.90 to 1.10) at a Y-coordinate (0.70)

(2) The range of Y-coordinates (0.90 to 1.10) at a Y-coordinate (1.50)

A region where connection of a wiring layer located on an upper layer to the terminal M2 is permitted is set at one portion given by vertex information (0.90, 0.70, 1.10, 1.50) at four corners.

As described above, according to the first embodiment, information on a wiring enable region, a wiring disable region, and the interval between the end face of a terminal and a wiring line different in longitudinal direction from the terminal is set for each terminal in addition to information on the outer shape of the terminal. Using this information, routing between terminals is executed. This can implement a more flexible, more appropriate routing process, increase the process efficiency, and prevent an increase in circuit area.

(2) SECOND EMBODIMENT

The second embodiment of the present invention will be described below.

When the longitudinal directions of wiring lines are different in placing the wiring lines, a so-called collision or interference phenomenon occurs. To avoid this phenomenon, the second embodiment performs routing in accordance with a sequence shown in the flowchart of FIG. 9. This routing process is applied to inter-terminal routing of step S6 in the whole process shown in FIG. 9.

A routing method according to the second embodiment can also employ the routing apparatus shown in FIG. 6 in executing the routing process, similar to the first embodiment. The routing apparatus is implemented by causing a computer to read routing software according to the second embodiment that is stored in a computer-readable recording medium, and execute the routing process.

Figure 9:
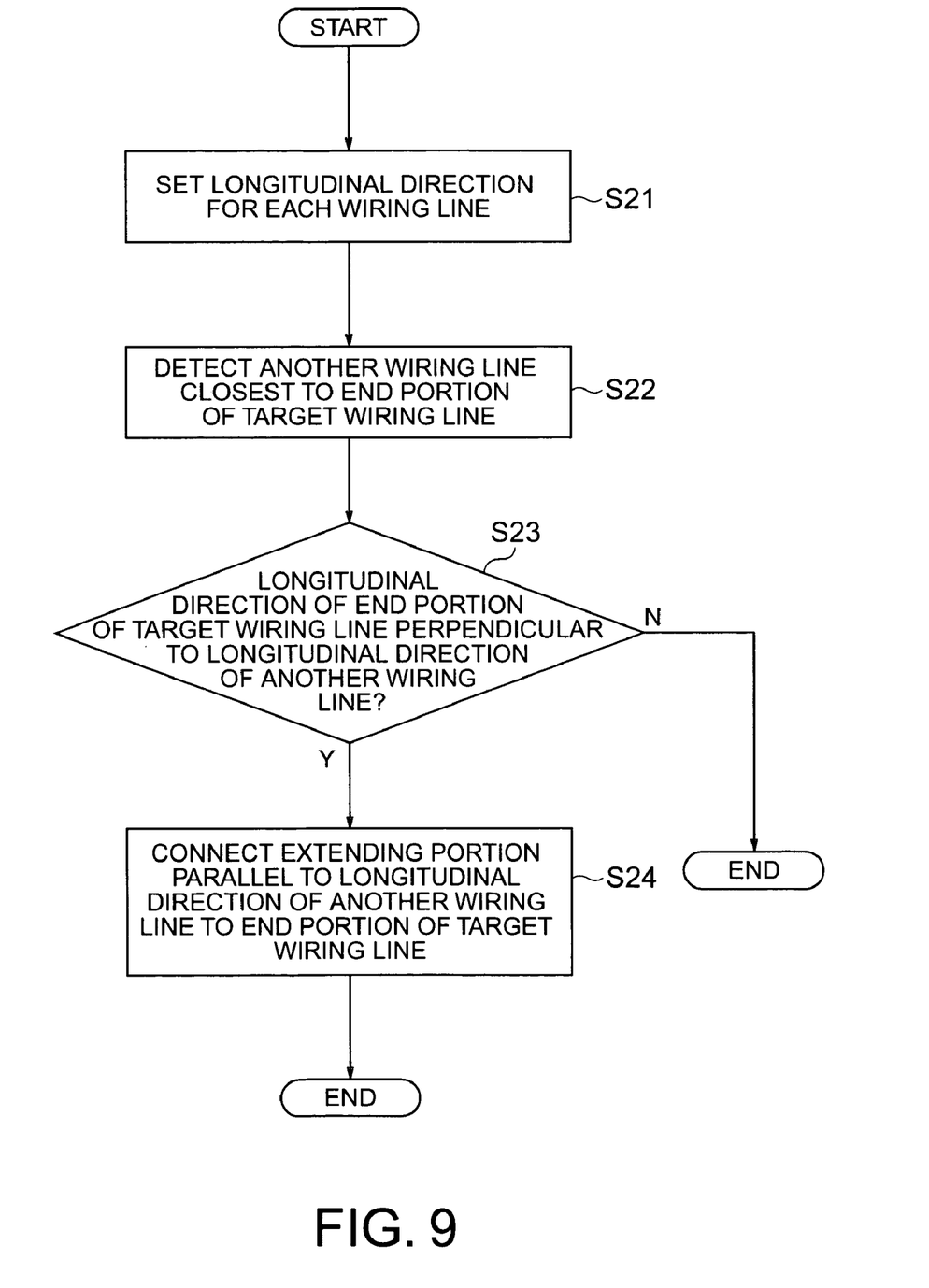
FIG. 9 is a flowchart showing the sequence of a routing method according to the second embodiment of the present invention.

In step S21, information on the longitudinal direction of a wiring line, i.e., the X or Y direction is set in an input unit 101 for each wiring line. The set information is stored in a storage unit 103.

Figure 10:
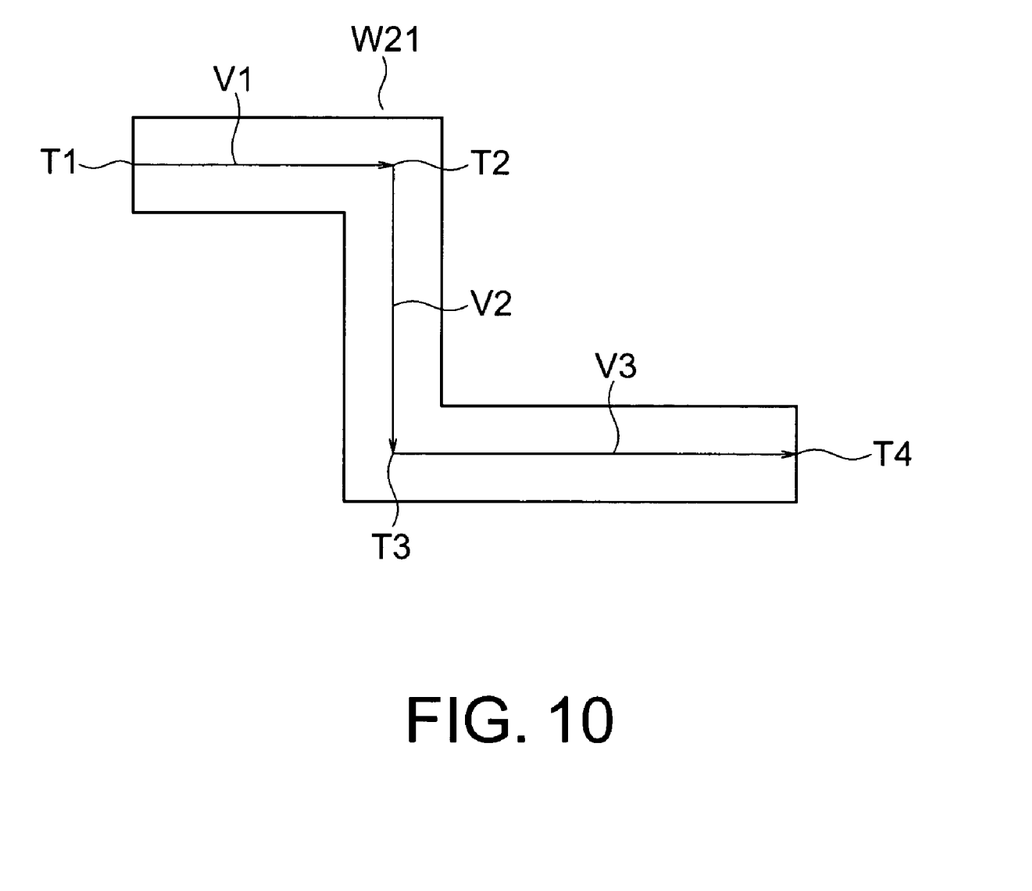
FIG. 10 is an explanatory view showing the definition of a wiring line according to the second embodiment.

A concrete example of defining a wiring line by defining the longitudinal direction of the wiring line will be explained with reference to FIG. 10. If a wiring line W21 having two bent portions is defined using the coordinates of the outer shape, the data amount increases because the wiring line W21 has eight vertexes.

To the contrary, according to the second embodiment, the wiring line W21 is defined by vectors V1, V2, and V3 representing the longitudinal direction of the wiring line. That is, the wiring line W21 is defined by the vector V1 from a start point T1 to an end point T2, the vector V2 from a start point T2 to an end point T3, and the vector V3 from a start point T3 to an end point T4.

This definition can decrease the number of vertexes from eight to four, and reduce the data amount.

Figure 11:
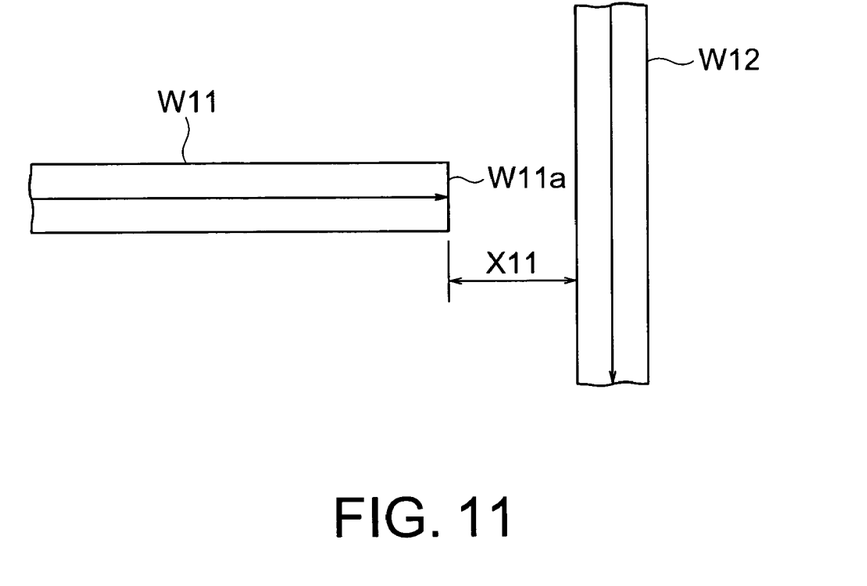
FIG. 11 is an explanatory view showing one step in the routing method according to the second embodiment.

In step S22, as shown in FIG. 11, another wiring line W12 closest to an end portion W11a of a wiring line W11 is detected by an arithmetic unit 102 on the basis of information stored in the storage unit 103.

In step S23, the arithmetic unit 102 detects whether the longitudinal direction (X direction) of the wiring line W11 that is represented by the vector is parallel or perpendicular to the longitudinal direction (Y direction) of the wiring line W12 that is represented by the vector.

Figure 12:
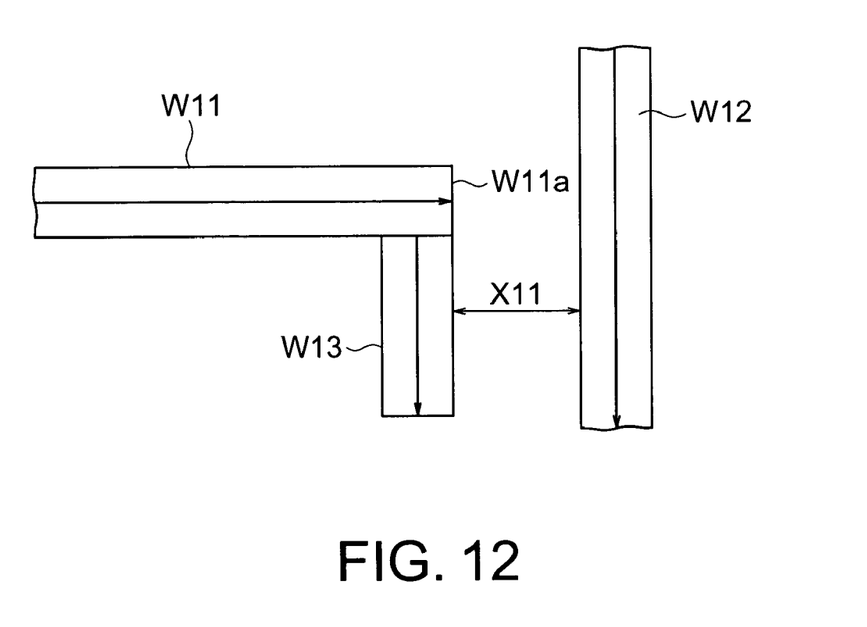
FIG. 12 is an explanatory view showing one step in the routing method according to the second embodiment.

If these longitudinal directions are parallel to each other in step S24, the flow ends; if they are perpendicular to each other, shifts to step S25. As shown in FIG. 12, the arithmetic unit 102 performs a process of connecting an extending portion W13 to the end portion W11a (end point of the vector) of the wiring line W11 in a direction parallel to the wiring line W12, and then the flow ends.

Accordingly, the second embodiment prevents the collision or interference phenomenon generated when wiring lines having different longitudinal directions run close to each other. The second embodiment can increase the routing efficiency, and suppress an increase in circuit area.

(3) THIRD EMBODIMENT

The third embodiment of the present invention will be explained below.

The third embodiment uses information which defines the signal transfer direction of each wiring line by using the vector.

Figure 13:
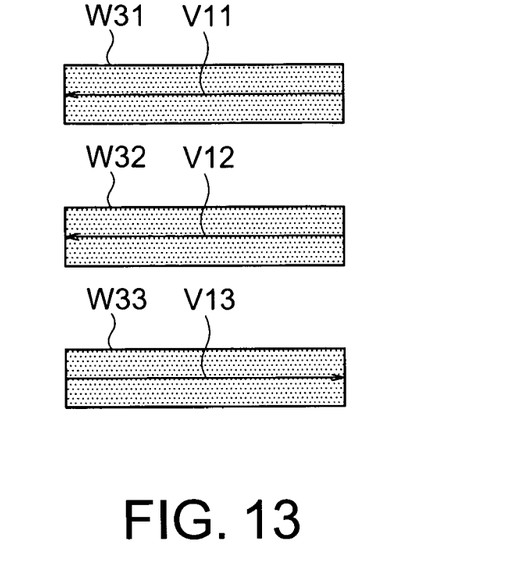
FIG. 13 is an explanatory view showing the definition of a signal transfer direction in a routing method according to the third embodiment of the present invention.

For example, as shown in FIG. 13, of three wiring lines W31 to W33 placed parallel to each other, the wiring lines W31 and W32 transfer signals to the left in FIG. 13, and are represented by vectors V11 and V12. The wiring line W33 transfers a signal to the right in FIG. 13, and is represented by a vector V13.

When signals are transferred in the same direction, like the wiring lines W31 and W32, timings when signals are transferred are often considered to be the same.

Figure 14:
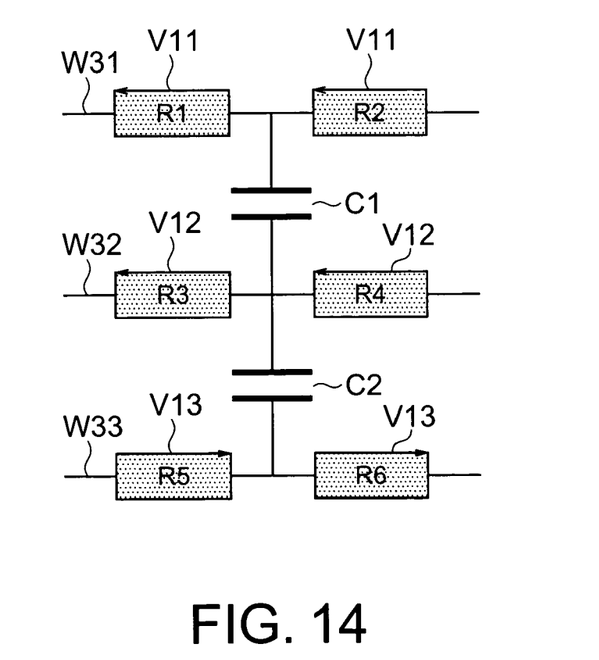
FIG. 14 is an explanatory view showing interference between different signals in accordance with the signal transfer direction in the routing method according to the third embodiment.

As shown in FIG. 14, the wiring line W31 has resistances R1 and R2, and the wiring line W32 has resistances R3 and R4. A parasitic resistance C1 exists between the wiring lines W31 and W32.

For this reason, the wiring lines W31 and W32 are preferably placed at a predetermined interval equal to or larger than a minimum interval defined by the design rule so as to prevent noise generated by interference between signals.

In FIG. 14, the wiring line W32 has the resistances R3 and R4, and the wiring line W33 has resistances R5 and R6. A parasitic resistance C2 exists between the wiring lines W32 and W33.

However, the mutual influence of signals is considered to be small because the wiring lines W32 and W33 transfer signals in different directions and timings when the signals are transferred are different. The interval between the wiring lines W32 and W33, therefore, suffices to satisfy at least a minimum interval defined by the design rule.

Figure 15:
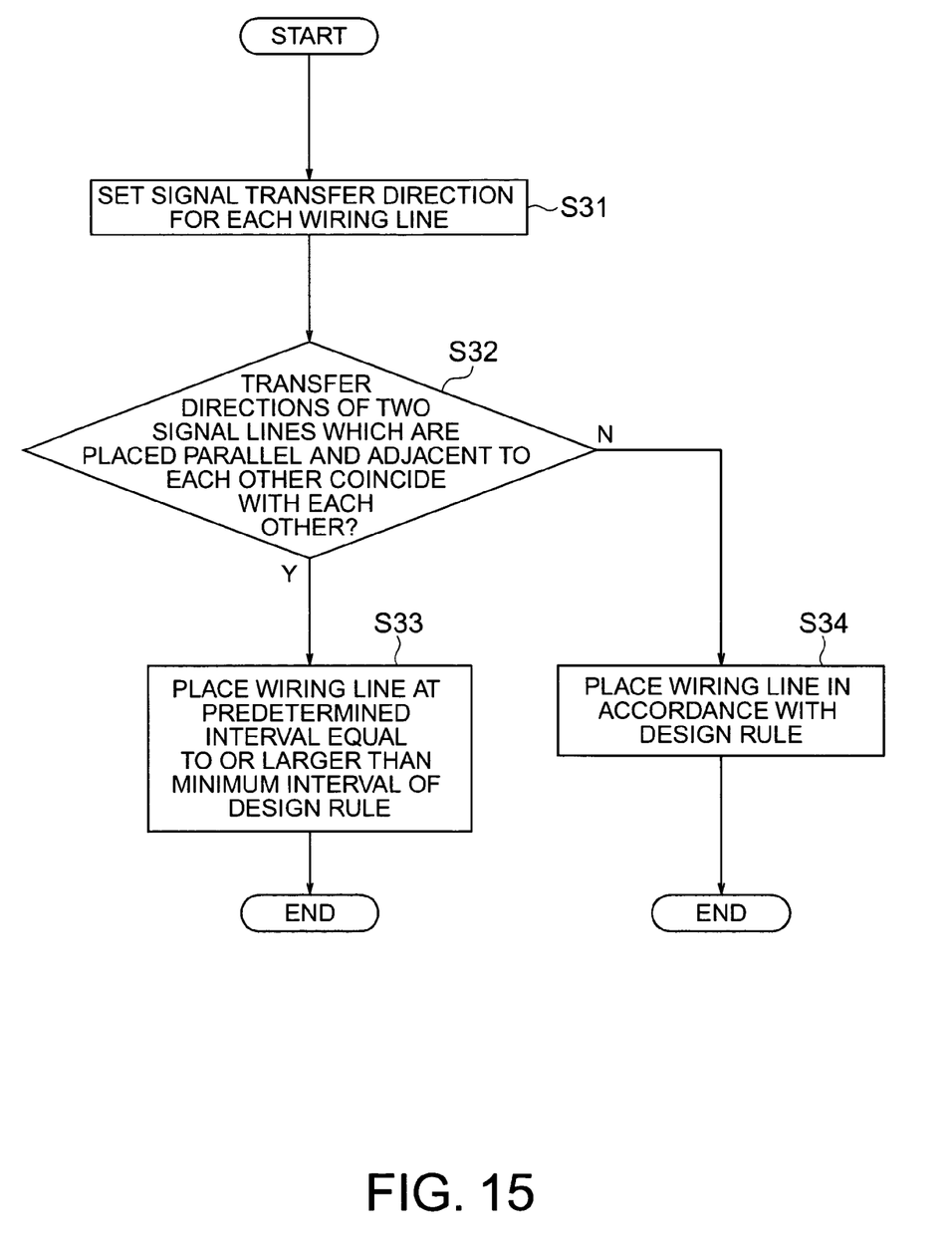
FIG. 15 is a flowchart showing the sequence of a process in the routing method according to the third embodiment.

The sequence of a process by a routing method according to the third embodiment will be explained with reference to FIG. 15.

The routing method according to the third embodiment can also adopt the routing apparatus shown in FIG. 6 in executing the routing process, similar to the first and second embodiments. The routing apparatus is implemented by causing a computer to read routing software according to the third embodiment that is stored in a computer-readable recording medium, and execute the routing process.

In step S31, a signal transfer direction is set by the vector in an input unit 101 for each wiring line. The set information is stored in a storage unit 103.

In step S32, an arithmetic unit 102 determines whether the transfer directions of two adjacent signal lines out of signal lines placed parallel to each other coincide with each other.

If the transfer directions of the two signal lines coincide with each other, signals may interfere with each other, so the arithmetic unit 102 places in step S33 the signal lines at a predetermined interval equal to or larger than a minimum interval defined by the design rule. If the transfer directions of the two signal lines are different from each other, the mutual influence of signals is considered to be small, so the arithmetic unit 102 places the signal lines in accordance with the design rule in step S34.

The third embodiment executes routing by using information which defines a signal transfer direction by the vector, and can perform the routing process in consideration of mutual interference between signals without consuming a wasteful area.

As has been described above, the semiconductor integrated circuit routing method according to the third embodiment and the recording medium which stores routing software can increase the routing efficiency.

The above-described embodiments are merely examples and do not limit the present invention. The present invention can be variously modified within the technical scope of the invention.

What is claimed is:

1. A method of routing a semiconductor integrated circuit by using a routing apparatus having an input unit, a storage unit, and an arithmetic unit, comprising:

receiving, by the input unit, for respective terminals of a plurality of elements contained in the semiconductor integrated circuit, wiring enable/disable information which sets a region where a connection of a wiring line is enabled and a region where a connection of a wiring line is disabled, and storing, the wiring enable/disable information in the storage unit; and determining, by the arithmetic unit using the wiring enable/disable information stored in the storage unit, whether a connection of a wiring line to a predetermined portion of a terminal of an element is enabled, and when the arithmetic unit determines that the connection of the wiring line is enabled, executing the connection, wherein the wiring enable/disable information sets wiring enable regions at two end portions of the terminal, sets a wiring disable region at a central portion of the terminal except the two end portions, and sets an interval between either end face of the terminal and another wiring line different in longitudinal direction from the terminal to a predetermined interval not smaller than a minimum interval defined by a design rule.

2. The method according to claim 1, further comprising:

receiving, by the input unit, circuit net information of a circuit obtained by connecting terminals of a plurality of elements by wiring lines and storing, in the storage unit, the circuit net information;

receiving, by the input unit, element information on outer shapes of the plurality of elements and storing, in the storage unit, the element information; and placing, by the arithmetic unit, the plurality of elements by using the circuit net information and the element information which are stored in the storage unit, wherein when the arithmetic unit executes routing, the method further includes, setting, by the arithmetic unit a connection of a wiring line to a predetermined portion of a terminal of a placed element, determining, by the arithmetic unit, by using the wiring enable/disable information stored in the storage unit, whether the connection of the wiring line to the predetermined portion of the terminal is enabled, and executing, by the arithmetic unit, the connection, when the arithmetic unit determines that the connection of the wiring line is enabled.

3. The method according to claim 1, wherein in the wiring enable/disable information, when the longitudinal direction of the terminal is a first direction, a wiring line can be connected in a second direction perpendicular to the first direction to a side surface of the terminal except end faces at the two end portions in the wiring enable region, and a wiring line can be connected to the end face in the first direction.

4. The method according to claim 1, wherein in the wiring enable/disable information, when the longitudinal direction of the terminal is a first direction, a wiring line can be connected in a second direction perpendicular to the first direction to a side surface of the terminal except at end faces at the two end portions in the wiring enable region, and a wiring line can be connected to the end face in the first direction.

5. The method according to claim 1, further comprising:
receiving, by the input unit, information representing a longitudinal direction for each of a plurality of wiring lines contained in the semiconductor integrated circuit, and storing, in the storage unit, the information;
detecting, by the arithmetic unit, a second wiring line closest to an end portion of a first wiring line among the plurality of wiring lines;
determining, by the arithmetic unit using the information stored in the storage unit, whether a longitudinal direction of the first wiring line and a longitudinal direction of the second wiring line are perpendicular to each other; and
when the longitudinal direction of the first wiring line and the longitudinal direction of the second wiring line are perpendicular to each other, adding, by the arithmetic unit, an extending portion parallel to the longitudinal direction of the second wiring line to the end portion of the first wiring line.

6. The method according to claim 1, further comprising:
receiving, by the input unit, information representing a signal transfer direction for each of a plurality of wiring lines contained in the semiconductor integrated circuit, and storing, in the storage unit, the information;
causing the arithmetic unit to detect a second wiring line which is placed parallel and adjacent to a first wiring line among the plurality of wiring lines;
causing the arithmetic unit to determine by using the information stored in the storage unit whether a signal transfer direction of the first wiring line and a signal transfer direction of the second wiring line coincide with each other; and
when the arithmetic unit determines that the signal transfer direction of the first wiring line and the signal transfer direction of the second wiring line coincide with each other, setting, by the arithmetic unit, an interval between the first wiring line and the second wiring line to a predetermined interval not smaller than a minimum interval defined by a design rule.

7. A computer-readable recording medium which stores routing software for executing routing of a semiconductor integrated circuit, the routing software causes a computer to execute a routing method comprising:
setting, for respective terminals of a plurality of elements contained in the semiconductor integrated circuit, a region where a connection of a wiring line is enabled and a region where a connection of a wiring line is disabled, and setting wiring enable/disable information, and
determining on the basis of the wiring enable/disable information whether a connection of a wiring line to a predetermined portion of a terminal of an element is enabled, and when the connection of the wiring line is determined to be enabled, executing the connection, wherein
the wiring enable/disable information sets wiring enable regions at two end portions of the terminal, sets a wiring disable region at a central portion of the terminal except the two end portions, and sets an interval between either end face of the terminal and another wiring line different in longitudinal direction from the terminal to a predetermined interval not smaller than a minimum interval defined by a design rule.

8. The computer-readable recording medium according to claim 7, further comprising:
placing the element by using net information of a circuit obtained by connecting terminals of a plurality of elements by wiring lines, and element information on outer shapes of the plurality of elements, wherein
when the connection of a wiring line is executed, the routing method further includes
setting a connection of a wiring line to a predetermined portion of the terminal for each terminal of a placed element,
determining on the basis of the wiring enable/disable information whether the connection of the wiring line to the predetermined portion of the terminal is enabled, and
when the connection of the wiring line is determined to be enabled, executing the connection.

9. The computer-readable recording medium according to claim 8, wherein in the wiring enable/disable information, when the longitudinal direction of the terminal is a first direction, a wiring line can be connected in a second direction perpendicular to the first direction to a side surface of the terminal except at end faces at the two end portions in the wiring enable region, and a wiring line can be connected to the end face in the first direction.

10. The computer-readable recording medium according to claim 7, wherein in the wiring enable/disable information, when the longitudinal direction of the terminal is a first direction, a wiring line can be connected in a second direction perpendicular to the first direction to a side surface of the terminal except at end faces at the two end portions in the wiring enable region, and a wiring line can be connected to the end face in the first direction.

11. The computer-readable recording medium according to claim 7, wherein the routing software causes a computer to execute a routing method comprising:
setting information representing a longitudinal direction for each of a plurality of wiring lines contained in the semiconductor integrated circuit;
detecting a second wiring line closest to an end portion of a first wiring line among the plurality of wiring lines;
determining by using the information whether a longitudinal direction of the first wiring line and a longitudinal direction of the second wiring line are perpendicular to each other; and
when the longitudinal direction of the first wiring line and the longitudinal direction of the second wiring line are perpendicular to each other, adding an extending portion parallel to the longitudinal direction of the second wiring line to the end portion of the first wiring line.

12. The computer-readable recording medium according to claim 7, wherein the routing software causes a computer to execute a routing method comprising:
setting information representing a signal transfer direction for each of a plurality of wiring lines contained in the semiconductor integrated circuit;
detecting a second wiring line which is placed parallel and adjacent to a first wiring line among the plurality of wiring lines;
determining by using the information whether a signal transfer direction of the first wiring line and a signal transfer direction of the second wiring line coincide with each other; and
when the signal transfer direction of the first wiring line and the signal transfer direction of the second wiring line coincide with each other, setting an interval between the first wiring line and the second wiring line to a predetermined interval not smaller than a minimum interval defined by a design rule.

* * * * *